United States Patent
Ikeda

(10) Patent No.: US 6,922,331 B2
(45) Date of Patent: Jul. 26, 2005

(54) BUS BAR STRUCTURE OF ELECTRIC DISTRIBUTION BOX

(75) Inventor: Naoyuki Ikeda, Ogasa-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/637,538

(22) Filed: Aug. 11, 2003

(65) Prior Publication Data

US 2004/0032703 A1 Feb. 19, 2004

(30) Foreign Application Priority Data

Aug. 9, 2002 (JP) .................................... P2002-233482

(51) Int. Cl.[7] .............................................. H02B 1/26
(52) U.S. Cl. ...................... 361/624; 361/626; 363/146
(58) Field of Search ................. 361/611, 624, 361/637–639, 648, 649, 775; 174/16.2, 71 B, 72 B; 439/76.2

(56) References Cited

U.S. PATENT DOCUMENTS

| | | | | |
|---|---|---|---|---|
| 5,795,193 A | * | 8/1998 | Yang ........................... | 439/621 |
| 6,077,102 A | * | 6/2000 | Borzi et al. .................. | 439/364 |
| 6,178,106 B1 | * | 1/2001 | Umemoto et al. .......... | 363/146 |
| 6,322,376 B1 | * | 11/2001 | Jetton ......................... | 439/76.2 |
| 6,325,640 B1 | * | 12/2001 | Kasai .......................... | 439/76.2 |
| 6,493,234 B2 | * | 12/2002 | Sunami et al. .............. | 361/752 |
| 6,547,572 B1 | * | 4/2003 | Burdick ....................... | 439/76.2 |
| 6,602,079 B2 | * | 8/2003 | Chiriku et al. .............. | 439/76.2 |
| 6,614,203 B2 | * | 9/2003 | Yuasa et al. ................. | 320/104 |
| 2001/0039131 A1 | * | 11/2001 | Murakami et al. ......... | 439/76.2 |
| 2003/0022536 A1 | * | 1/2003 | Saito et al. ................. | 439/76.2 |

FOREIGN PATENT DOCUMENTS

| | | | | |
|---|---|---|---|---|
| JP | 05260628 A | * | 10/1993 | ............ H02G/3/16 |
| JP | 06-231670 A | | 8/1994 | |
| JP | 7-16313 Y2 | | 4/1995 | |
| JP | 09-283004 A | | 10/1997 | |

* cited by examiner

*Primary Examiner*—Boris Chervinsky
(74) *Attorney, Agent, or Firm*—Sughrue Mion, PLLC

(57) ABSTRACT

In an electric distribution box (1), electric power, supplied from an alternator (ALT), is supplied to fusible links (F/L) via a power supply terminal (4) and a bus bar (3). The bus bar (3) includes a first bus bar (3B), forming a path for supplying necessary supply electric power for a maximum load condition from a connection bus bar (3A) connected to the power supply terminal (4), and a second bus bar (3C) forming a path for supplying an excessive proportion of the maximum electric power, generated by the alternator, over the necessary supply electric power for the maximum load condition.

11 Claims, 3 Drawing Sheets

BUS BAR STRUCTURE OF ELECTRIC DISTRIBUTION BOX

BACKGROUND OF THE INVENTION

This invention relates to an electric distribution box such as a fuse box, and more particularly to a bus bar structure of an electric distribution box receiving a bus bar through which electric power, supplied from an alternator (ALT), is supplied to various elements.

A battery mounted on an automobile serves as a power source for supplying necessary electric power for igniting an air/fuel mixture, for lighting lamps, for starting an engine and for other purposes. However, a capacity of electric power that can be stored in the battery is limited, and therefore the battery can not continuously supply the necessary electric power to the automobile. Therefore, during the travel of the automobile, electric power has been supplied to various electrical equipments, using a charging apparatus for converting a propelling force of the automobile into electric power.

During the travel of the automobile, such a charging apparatus supplies electric power to the various electrical equipments, and also charges the battery by its excess electric power so that the battery can supply electric power whenever necessary. This charging apparatus comprises a generator (dynamo generator), a regulator, a battery, and a wire harness. When thus using the generator (dynamo generator), electric power, required during the travel, can be supplied by this generator. At this time, if the amount of this supplied electric power is insufficient, the battery also functions as a power source. In contrast, when the amount of generation of the electric power by the generator is larger than the amount of used electric power, the generator charges the battery by its excess electric power. Namely, the generator serves as the power source during the travel, and also serves to charge the battery.

Such generators (dynamo generators) are classified into a DC generator and an alternator (AC generator). In recent years, traffic congestion in and around cities has been terrible, and in such a condition the speed of running of a car is low, and besides since the car frequently stops, the time of idling of the engine much increases. In addition, various accessories, such as a cooler and a heater, consume a large amount of electric power. When the amount of consumption of electric power thus increases, the conventional DC generator can not meet such power consumption by its output power, so that the battery becomes rather discharged. Therefore, in order to deal with this large electric load, there has recently been used an alternator (ALT) having the function of charging the battery even during the idling of the engine. This alternator (ALT) has a slip ring, and therefore has advantages that a brush has a long lifetime since there occurs no spark, that the strength of a rotor at high speed is high, that rectifying characteristics are good and that the charging can be effected even during the idling.

Therefore, driving electric power for driving various on-vehicle equipments, mounted on the automobile, are supplied from the battery when starting the engine and when the engine is stopped, and also such driving electric power is supplied from the alternator (ALT) during the travel of the automobile (during the driving of the engine). The electric power, supplied from the battery, is generally stable, but the electric power, supplied from the alternator (ALT), varies with a running condition of the automobile. Particularly when a large electric current is abruptly supplied to the various on-vehicle equipments, there is a fear that the on-vehicle equipments, supplied with the electric power, are damaged. Therefore, usually, electric power, supplied from the alternator (ALT), is fed via a bus bar to fusible links (F/L) and fuses which serve as protective circuits for preventing electric power, larger than a predetermined value, from being supplied to the various on-vehicle equipments, and thus the electric power is supplied to the various on-vehicle electronic equipments via these fusible links (F/L) and fuses. The electric power is fed from a power supply terminal (connected to the alternator (ALT)) to the various on-vehicle equipments via the bus bar, and the fusible links (F/L) and fuses are connected to the power supply terminal, and these fusible links (F/L) and fuses are gathered in one place to form one component, and function as an electric distribution box.

In a bus bar structure of one conventional electric distribution box as disclosed in JP-UM-B-7-16313, electric power is supplied from an alternator (ALT) to one end of a bus bar via a fusible link (F/L), and then is supplied to various loads from this bus bar. In another conventional bus bar structure as disclosed in JP-A-6-231670, electric power is supplied from an alternator (ALT) to a generally-central portion of a bus bar via a fusible link (F/L), and then is supplied from this bus bar to various loads via fuses. In a further conventional bus bar structure as disclosed in JP-A-9-283004, there is provided a wall covering a bus bar, and a window is formed in this wall.

In the bus bar structures of these conventional electric distribution boxes, however, the generation of heat by the bus bar is not taken into consideration. Namely, although the electric power (electric current), supplied from the alternator (ALT), is larger than electric power (electric current) required by the various on-vehicle equipments, the bus bar structure is uniform.

The various on-vehicle equipments do not require all of the electric power generated by and supplied from the alternator (ALT). Therefore, the various on-vehicle equipments use a necessary amount of electric power out of the electric power (generated by and supplied from the alternator (ALT)), leaving part of this supplied electric power, and the remainder is used for charging a battery. The bus bar for supplying the necessary electric current to the various on-vehicle equipments is different in size from the bus bar for supplying the excess electric current. Namely, the width of the bus bar for supplying the electric power (electric current) to the battery is larger than the width of the bus bar for supplying the necessary electric current of a larger amount to the various on-vehicle equipments.

However, in the bus bar structures of the conventional electric distribution boxes, the width of the bus bar for supplying the electric power (electric current) to the battery is equal to the width of the bus bar for supplying the necessary electric current to the various on-vehicle equipments, and the bus bar for supplying the electric power (electric current) to the battery is formed in continuous relation to the bus bar for supplying the necessary electric current to the various on-vehicle equipments. Namely, the same current flows through the whole of the bus bar. Therefore, all of the electric power (electric current), generated by and supplied from the alternator (ALT), flows through the whole of the bus bar.

Therefore, in the bus bars of each of the conventional electric distribution boxes, when the electric power (electric current), generated by and supplied from the alternator (ALT), is at a peak, the whole of the bus bar serves as a heat-generating body to generate heat, thus inviting a problem that the generation of heat in the electric distribution box can not be sufficiently suppressed, so that it is difficult to suppress a temperature rise within the electric distribution box.

SUMMARY OF THE INVENTION

It is an object of this invention to provide a bus bar structure of an electric distribution box in which when electric power is supplied from an alternator (ALT) in an amount more than the necessary supply electric power for a maximum load condition, heat, generated in the whole of a bus bar, can be reduced to a smaller amount as compared with the conventional structures.

In order to solve the aforesaid object, the invention is characterized by having the following arrangement.

Aspect 1. A bus bar provided in an electric distribution box through which electric power from an alternator is supplied to a fusible link comprising:
  a connection bus bar to be connected to a power supply terminal connected to the alternator;
  a first bus bar forming a path for supplying necessary supply electric power for a maximum load condition from the connection bus bar; and
  a second bus bar forming a path for supplying an excessive proportion of the maximum electric power, generated by the alternator, over the necessary supply electric power for the maximum load condition.
Aspect 2. The connection bus bar, the first bus bar and the second bus are integrally formed.
Aspect 3. The first and second bus bars are directly connected to the connection bus bar, respectively.
Aspect 4. The connection bus bar is interposed between the first and second bus bars.
Aspect 5. The connection bus bar, the first bus bar and the second bus bar jointly assume a generally U-shape.
Aspect 6. The first bus bar is mounted in the electric distribution box in contiguous relation to an inner surface of a wall of the electric distribution box;
Aspect 7. The first bus bar is formed into such a width capable of supplying the necessary supply electric power for the maximum load condition and various on-vehicle electronic equipments are connected to the first bus bar; and
  the second bus bar is formed into such a width capable of supplying the maximum excessive proportion of the maximum electric power and an automotive battery is connected to the second bus bar.

DETAILED DESCRIPTION OF PREFERRED EMBODIMENTS

A preferred embodiment of the present invention will now be described with reference to the drawings.

Figure 1:
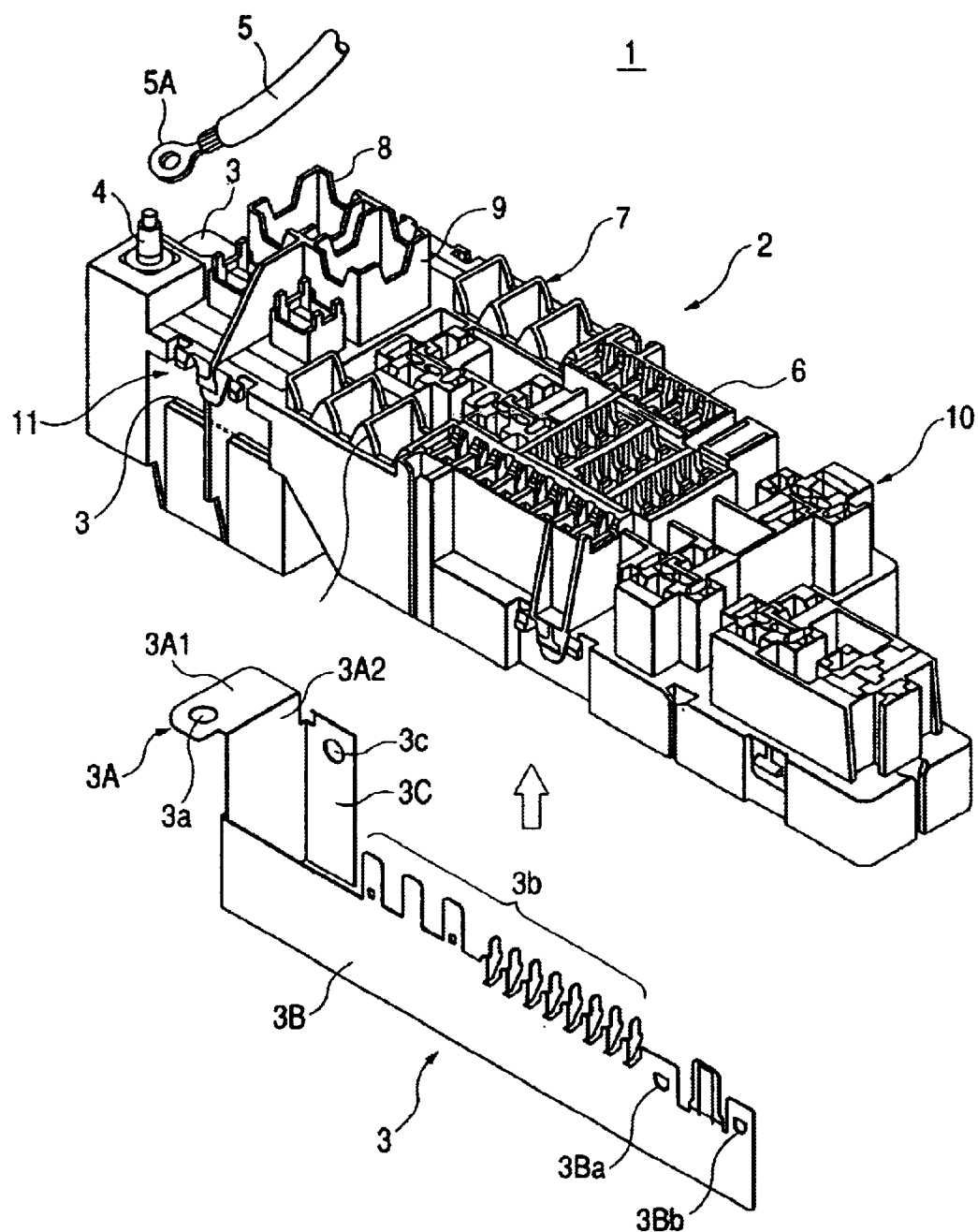
FIG. 1 is a perspective view of one preferred embodiment of a bus bar structure of an electric distribution box of the invention in an assembled condition.
Figure 2:
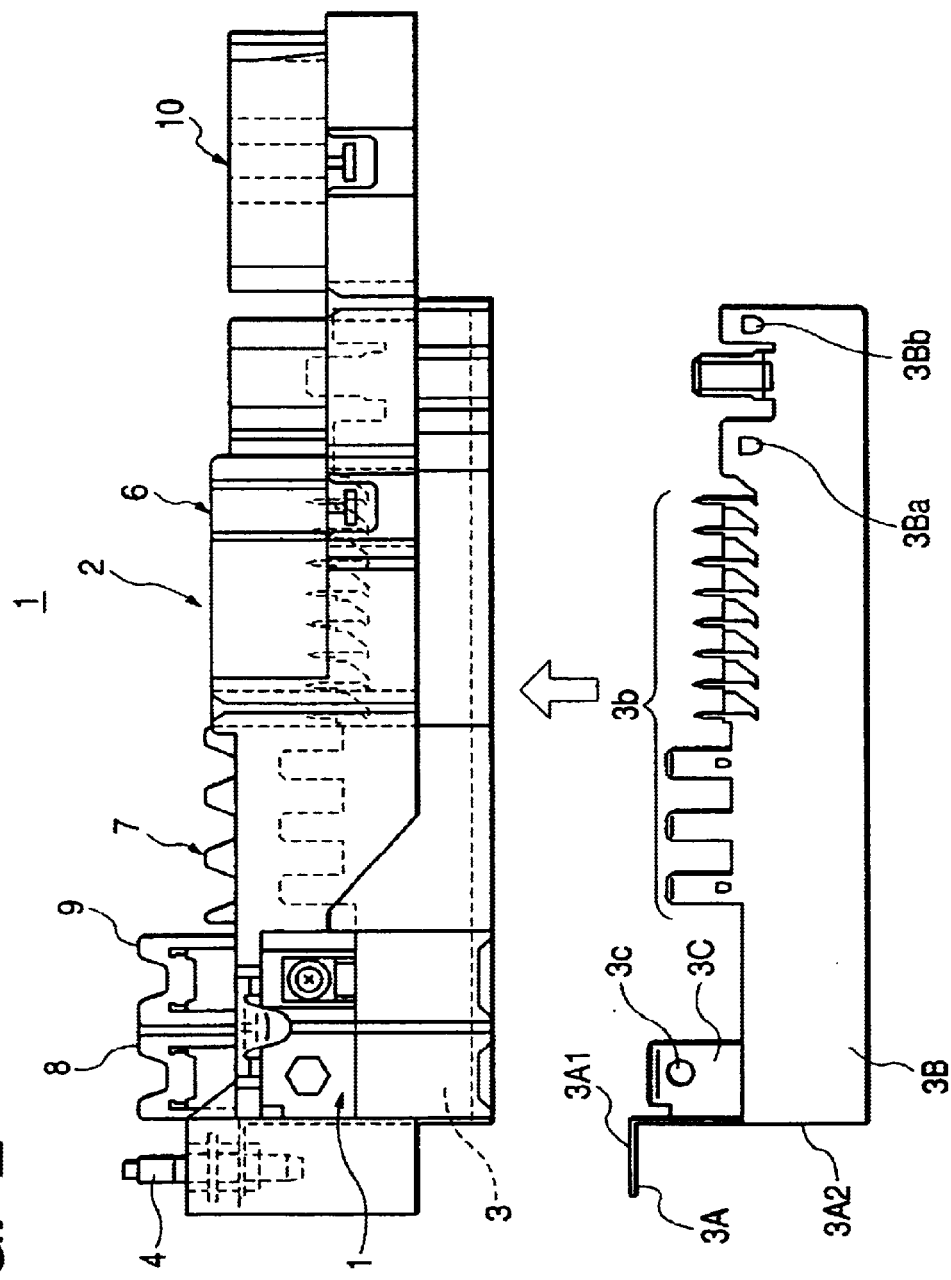
FIG. 2 is a front-elevational view showing a condition in which a bus bar of FIG. 1 is mounted in a body.
Figure 3:
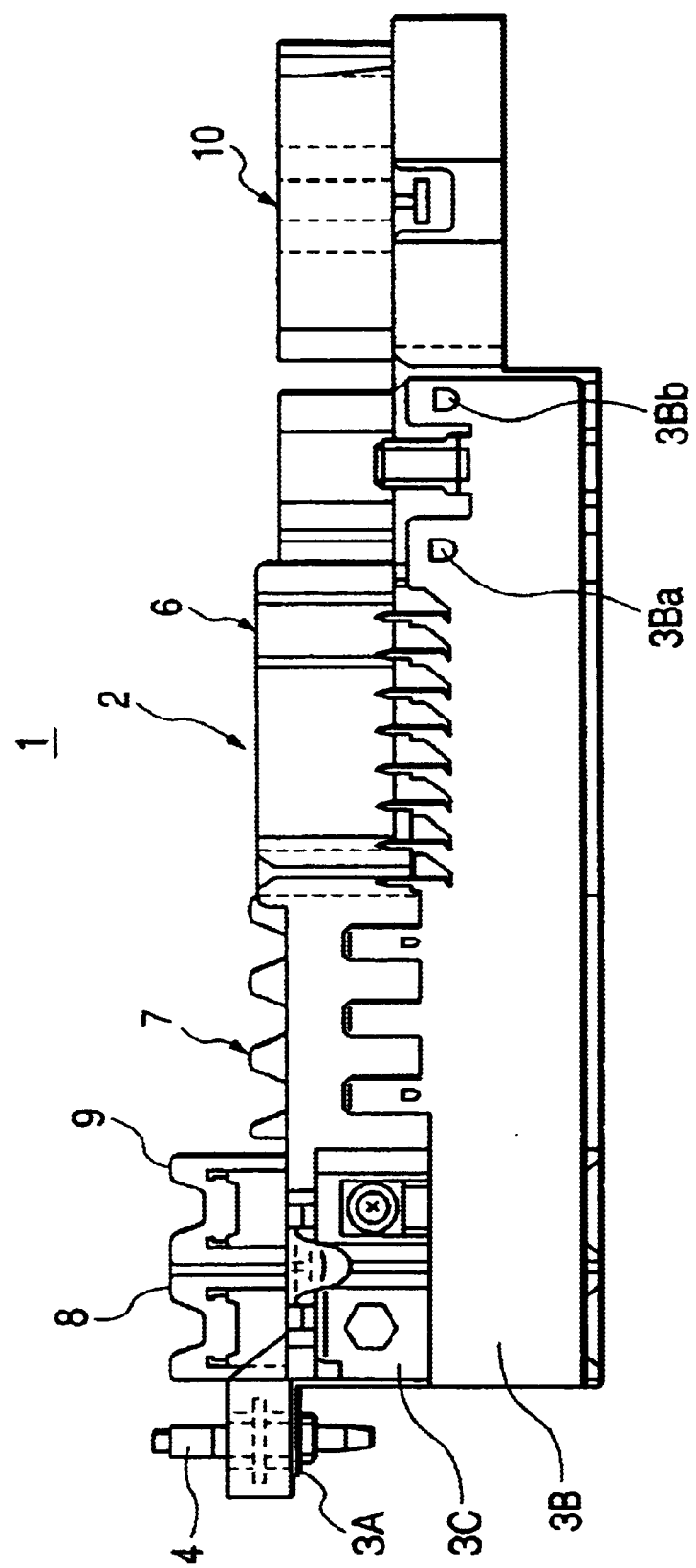
FIG. 3 is a front-elevational view showing a condition in which the bus bar of FIG. 2 is mounted in the body, with a front wall (to which the bus bar is attached) removed.

FIGS. 1 to 3 show one preferred embodiment of a bus bar structure of an electric distribution box of the invention.

In FIGS. 1 to 3, reference numeral 1 denotes the electric distribution box to be mounted on a vehicle or the like, and this electric distribution box 1 comprises a body 2, and a bus bar 3 inserted in this body 2.

A bar-like power supply terminal 4 is provided on an upper surface of the body 2 at one end portion thereof, and projects upwardly therefrom. A mounting terminal 5A of a power supply wire 5, connected to an alternator (ALT), is adapted to be connected to the power supply terminal 4. Electric power, generated by the alternator (ALT), is supplied to the power supply terminal 4, and this power supply terminal 4 feeds the electric power, supplied from the alternator (ALT), to various on-vehicle electronic equipments mounted on the automobile.

A fuse box 6, comprising a plurality of fuse-fitting portions for respectively receiving fuses (not shown) for small loads, a small fusible link box 7, comprising a plurality of fusible link-fitting portions for respectively receiving fusible links (not shown) for small loads, and two large fusible link-fitting portions 8 and 9 for respectively receiving fusible links (not shown) for large loads are provided at the upper surface of the body 2. These fusible links are protective fuses usually used when electric power, larger in capacity than electric power supplied to ordinary on-vehicle electronic equipments, is supplied.

Cavities 10 are formed in the upper surface of the body 2, and relays are mounted in these cavities 10.

The bus bar 3 forms a power circuit for feeding electric power, supplied from the alternator (ALT), to the various on-vehicle electronic equipments and a battery. Namely, by providing this bus bar 3, the electric power, supplied from the alternator (ALT), supplies the necessary electric current to the various on-vehicle electronic equipments through connectors (mounted in the cavities 10) and wire harnesses, and also excess electric power over an amount, needed for driving the various on-vehicle electronic equipments, is supplied to the battery. This bus bar 3 is adapted to be mounted in the body 2 of the electric distribution box 1 from a lower side thereof.

The bus bar 3 has a connection bus bar 3A of a generally L-shape which is adapted to be connected to the power supply terminal 4. A bolt insertion hole 3a for fitting on the power supply terminal 4 is formed through one leg portion 3A1 of the L-shaped connection bus bar 3A. A first bus bar 3B for feeding electric power, supplied from the alternator (ALT), to the various on-vehicle electronic equipments extends from one side edge of the other leg portion 3A2 of the L-shaped connection bus bar 3A in perpendicularly-bent relation thereto. This first bus bar 3B need only to have such a capacity as to supply electric power (electric current) of an amount required for the maximum load condition of the various on-vehicle electronic equipments connected to the electric distribution box 1. Therefore, this first bus bar 3B is formed into such a height as to supply electric power of an amount necessary for the maximum load condition of the various on-vehicle electronic equipments. Terminals 3b for connection to the small-load fuses are formed at an upper edge of the first bus bar 3B, and these terminals 3b can be inserted into the fuse box 6 from the lower side of the body 2. Engagement portions 3Ba and 3Bb are formed in a distal end portion (right end portion in FIG. 1) of the first bus bar 3B, and when the bus bar 3 is inserted into the body 2 of the electric distribution box 1, projections, formed on the body 2, are engaged respectively in these engagement portions 3Ba and 3Bb, thereby fixing the bus bar 3.

A second bus bar 3C extends from the other side edge of the other leg portion 3A2 of the L-shaped connection bus bar 3A in perpendicularly-bent relation thereto, and has generally the same height as that of the other leg portion 3A2 of the connection bus bar 3A. Out of the electric power (electric current) supplied from the alternator (ALT), excess electric power (excess electric current) over the amount, needed for driving the various on-vehicle electronic equipments, is supplied to the battery by this second bus bar 3C. This second bus bar 3c is formed into such a height that it can supply to the battery an excessive proportion of the electric power (electric current), supplied from the alternator (ALT), over the necessary electric power supplied to the first bus bar 3B for driving the various on-vehicle electronic equipments. A bolt insertion hole 3c is formed through the second bus bar 3C.

The bolt insertion hole 3c in the second bus bar 3C can be viewed through an opening portion 11 formed in the front side of the body 2 of the electric distribution box 1. Namely, a bolt is inserted in to this bolt insertion hole through the opening portion 11 of the body 2 of the electric distribution box 1, and the second bus bar 3C, together with the fusible link mounted in the large fusible link-fitting portion 8, is fastened, and is fixed to this large fusible link-fitting portion 8 of the body 2 of the electric distribution box 1.

Thus, the bus bar 3 includes the first bus bar 3B and the second bus bar 3C between which the connection bus bar 3A is formed, and the first bus bar 3B is different in height (width) from the second bus bar 3C. The first bus bar 3B is formed into such a height (width) that the electric power (electric current) of an amount necessary for the maximum load condition of the various on-vehicle electronic equipments can flow through this first bus bar 3B, while the second bus bar 3C is formed into such a height (width) that it can supply to the battery an excessive proportion of the electric power (electric current), supplied from the alternator (ALT), over the electric power flowing through the first bus bar 3B. Therefore, the maximum supply electric power (the maximum supply electric current, for example, of 10A), supplied from the alternator (ALT), is supplied to the first bus bar 3B which allows the necessary current (for example, of 80A) for the maximum load condition of the various on-vehicle electronic equipments to flow therethrough, and the electric current (for example, of 20A) in excess of this amount is supplied as the excess electric power (the excess electric current) to the second bus bar 3C connected to the battery.

As described above, in this embodiment, the maximum supply electric power (the maximum supply electric current) can be divided into the two currents which are to be fed respectively to the various on-vehicle electronic equipments and the battery, and the amount of heat, produced in the first bus bar 3B serving to supply the electric power (electric current) to the various on-vehicle electronic equipments, can be reduced as much as possible.

The structure of the invention is constructed as described above, and therefore the following advantages are achieved.

When electric power is supplied from the alternator (ALT) in an amount more than the necessary supply electric power for the maximum load condition, the electric current, supplied from the alternator (ALT), can be divided into a current, required to be supplied to the various on-vehicle electronic equipments and a current (excess electric power) which is to be fed to the battery, and the amount of heat, produced in the bus bar (particularly, the bus bar serving to supply the electric current to the various on-vehicle electronic equipments), can be reduced. As a result, a temperature rise within the electric distribution box can be suppressed.

When electric power (electric current) is supplied from the alternator (ALT) in an amount more than the necessary supply electric power for the maximum load condition, the necessary current for the on-vehicle electronic equipment out of the current supplied from the alternator (ALT) is supplied to the first bus bar connected to the on-vehicle electronic equipments, and therefore the electric current, exceeding the amount required for the on-vehicle electronic equipments, will not be supplied to the first bus bar from the alternator (ALT). When the electric current, exceeding the amount required for the on-vehicle electronic equipments, is supplied from the alternator (ALT), this excess current is supplied to the second bus bar, and further is fed from this second bus bar to the battery. Thus, the electronic current, exceeding the amount required for the on-vehicle electronic equipments, will not be supplied to the first bus bar, and therefore the amount of heat, produced in the bus bar (particularly, the bus bar serving to supply the electronic current to the various on-vehicle electronic equipments), can be reduced, so that a temperature rise within the electric distribution box can be suppressed.

The compact structure can be obtained because of bending of the second bus bar although the bus bar includes the first bus bar, forming the path for supplying the necessary supply electric power for the maximum load condition from the connection bus bar connected to the power supply terminal, and the second bus bar forming the path for supplying an excessive proportion of the maximum electric power, generated by the alternator, over the necessary supply electric power for the maximum load condition, so that the current, supplied from the alternator (ALT), is divided into the two currents.

The compact structure can be obtained because of bending of the second bus bar although the bus bar includes the first bus bar, forming the path for supplying the necessary supply electric power for the maximum load condition from the connection bus bar connected to the power supply terminal, and the second bus bar forming the path for supplying an excessive proportion of the maximum electric power, generated by the alternator, over the necessary supply electric power for the maximum load condition, so that the current, supplied from the alternator (ALT), is divided into the two currents. And besides, the bus bar can be easily fixed from the outside because of the formation of the opening portion.

What is claimed is:

1. A bus bar provided in an electric distribution box through which electric power from an alternator is supplied to a fusible link comprising:

a connection bus bar to be connected to a power supply terminal connected to the alternator;

a first bus bar forming a path for supplying necessary supply electric power for a maximum load condition from the connection bus bar; and a second bus bar forming a path for supplying an excess electric power, generated by the alternator, over the necessary supply electric power for the maximum load condition;

wherein said first bus bar is different in width from said second bus bar.

2. The bus bar according to claim 1, wherein the connection bus bar, the first bus bar and the second bus bar are integrally formed.

3. The bus bar according to claim 2, wherein the first and second bus bar are directly connected to the connection bus bar, respectively.

4. The bus bar according to claim 2, wherein the connection bus bar is interposed between the first and second bus bars.

5. The bus bar according to claim 1, wherein the connection bus bar, the first bus bar and the second bus bar jointly assume a generally U-shape.

6. The bus bar according to claim 5, wherein the first bus bar is mounted in the electric distribution box in contiguous relation to an inner surface of a wall of the electric distribution box;
   the second bus bar is viewed through an opening portion extending upwardly beyond an upper edge of the first bus bar; and
   the second bus bar is fixed by a fixing member to a fusible link-receiving portion of the electric distribution box through the opening portion together with the fusible link.

7. The bus bar structure according to claim 1, wherein the first bus bar is formed into such a width capable of supplying the necessary supply electric power for the maximum load condition and various on-vehicle electronic equipments are connected to the first bus bar; and
   the second bus bar is formed into such a width capable of supplying the maximum excessive proportion of the maximum electric power and an automotive battery is connected to the second bus bar.

8. A system, including:
   the bus bar structure according to claim 1;
   the electric distribution box; and
   a fusible link-receiving portion of the electric distribution box;
   wherein the first bus bar is mounted in the electric distribution box in contiguous relation to an inner surface of a wall of the electric distribution box;
   the second bus bar is viewed through an opening portion extending upwardly beyond an upper edge of the first bus bar; and
   the second bus bar is fixed by a fixing member to the fusible link-receiving portion of the electric distribution box through the opening portion together with the fusible link.

9. A system, including:
   the bus bar structure according to claim 1;
   various on-vehicle electronic equipments; and
   an automotive battery;
   wherein the first bus bar is formed into such a width capable of supplying the necessary supply electric power for the maximum load condition, and the various on-vehicle electronic equipments are connected to the first bus bar; and
   the second bus bar is formed into such a width capable of supplying the excess electric power and the automotive battery is connected to the second bus bar.

10. A system, including:
    an electric distribution box;
    a fusible link-receiving portion of the electric distribution box; and
    a bus bar structure, provided in the electric distribution box through which electric power from an alternator is supplied to a fusible link, comprising;
      a connection bus bar to be connected to a power supply terminal connected to the alternator;
      a first bus bar forming a path for supplying necessary supply electric power for a maximum load condition from the connection bus bar; and
      a second bus bar forming a path for supplying an excess electric power generated by the alternator, over the necessary supply electric power for the maximum load condition;
    wherein the first bus bar is formed into such a width capable of supplying the necessary supply electric power for the maximum load condition, and a various on-vehicle electronic equipments are connected to the first bus bar; and
    the second bus bar is formed into such a width capable of supplying the excess electric power and an automotive battery is connected to the second bus bar.

11. A system, including:
    various on-vehicle electronic equipments;
    an automotive battery; and
    a bus bar structure provided in an electric distribution box through which electric power from an alternator is supplied to a fusible link, comprising
      a connection bus bar to be connected to a power supply terminal connected to the alternator;
      a first bus bar forming a path for supplying necessary supply electric power for a maximum load condition from the connection bus bar; and
      a second bus bar forming a path for supplying an excess electric power generated by the alternator, over the necessary supply electric power for the maximum load condition;
    wherein the first bus bar is formed into such a width capable of supplying the necessary supply electric power for the maximum load condition, and the various on-vehicle electronic equipments are connected to the first bus bar; and
    the second bus bar is formed into such a width capable of supplying the maximum excessive proportion of the maximum electric power and the automotive battery is connected to the second bus bar.

* * * * *